(12) United States Patent
Azam et al.

(10) Patent No.: US 11,290,065 B2
(45) Date of Patent: Mar. 29, 2022

(54) SWITCHED CAPACITOR RADIO FREQUENCY DIGITAL POWER AMPLIFIER AND RADIO FREQUENCY DIGITAL-TO-ANALOG CONVERTER

(71) Applicant: Intel IP Corporation, Santa Clara, CA (US)

(72) Inventors: Ali Azam, Salt Lake City, UT (US); Ashoke Ravi, Portland, OR (US); Bassam Khamaisi, Kafer Kana (IL); Ofir Degani, Nes-Ammin (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/650,882

(22) PCT Filed: Dec. 29, 2017

(86) PCT No.: PCT/US2017/068853
§ 371 (c)(1),
(2) Date: Mar. 26, 2020

(87) PCT Pub. No.: WO2019/132948
PCT Pub. Date: Jul. 4, 2019

(65) Prior Publication Data
US 2020/0321924 A1    Oct. 8, 2020

(51) Int. Cl.
*H03F 1/02*      (2006.01)
*H03F 3/00*      (2006.01)
(Continued)

(52) U.S. Cl.
CPC ............... *H03F 3/005* (2013.01); *H03F 3/19* (2013.01); *H03F 3/217* (2013.01); *H03M 1/0836* (2013.01)

(58) Field of Classification Search
CPC . H03F 3/005; H03F 3/19; H03F 3/217; H03F 3/2175; H03F 3/189;
(Continued)

(56) References Cited

U.S. PATENT DOCUMENTS 8,004,448 B2 *   8/2011   Garreau ................. H03M 1/14
                                                         341/172
8,547,177 B1 *  10/2013   Yoo ......................... H03F 1/565
                                                         330/295
(Continued)

OTHER PUBLICATIONS

Tao Lyu et al.: „A 12-Bit High-Speed Column-Parallel Two Step Single-Slope Analog-to-Digital Converter (ADC) for CMOS Image Sensors, Sensors 2014, 14, 21603-21625; doi:10-3390/s141121603; ISSN 1424-8220; published Nov. 17, 2014.
(Continued)

*Primary Examiner* — Khanh V Nguyen
(74) *Attorney, Agent, or Firm* — 2SPL Patent Attorneys PartG mbB; Yong Beom Hwang

(57) ABSTRACT

A switched capacitor digital power amplifier (DPA) or a digital-to-analog converter (DAC) is disclosed. The DPA/DAC includes a plurality of switched capacitor cells connected in parallel. Each switched capacitor cell includes a capacitor and a switch. The switch selectively drives the capacitor in response to an input digital codeword. The switched capacitor cells are divided into sub-arrays and a series capacitor is inserted in series between two adjacent sub-arrays of switched capacitor cells. All the sub-arrays of switched capacitor cells may be in a unary-coded structure. Alternatively, at least one of the sub-arrays may be in a C-2C structure and at least one another sub-array may be in a unary-coded structure. The switch in the switched capacitor cells is driven by a local oscillator signal, and a phase
(Continued)

correction buffer may be added for adjusting a delay of the local oscillator signal supplied to sub-arrays of switched capacitor cells.

16 Claims, 17 Drawing Sheets

(51) Int. Cl.
*H03F 3/19* (2006.01)
*H03F 3/217* (2006.01)
*H03M 1/08* (2006.01)

(58) Field of Classification Search
CPC .. H03F 3/45475; H03F 1/303; H03M 1/0836; H03M 1/802; H03M 1/68
USPC ...................................... 330/9; 327/124, 307
See application file for complete search history.

(56) References Cited

U.S. PATENT DOCUMENTS

| | | | |
|---|---|---|---|
| 8,674,867 | B1 | 3/2014 | Klepser et al. |
| 2008/0129573 | A1 | 6/2008 | Mueck et al. |
| 2011/0074221 | A1* | 3/2011 | Confalonieri ............ H03H 5/12 |
| | | | 307/109 |
| 2011/0148675 | A1* | 6/2011 | Zhao ................... H03M 1/1033 |
| | | | 341/118 |
| 2012/0287950 | A1 | 11/2012 | Yin et al. |
| 2014/0009200 | A1* | 1/2014 | Kay ....................... H03F 1/0277 |
| | | | 327/281 |
| 2014/0269976 | A1* | 9/2014 | Klepser ............... H04L 27/2647 |
| | | | 375/295 |

OTHER PUBLICATIONS

Z. Bai et al.: "A split-array, C-2C switched-capacitor power amplifier in 65nm CMOS", IEEE.

* cited by examiner

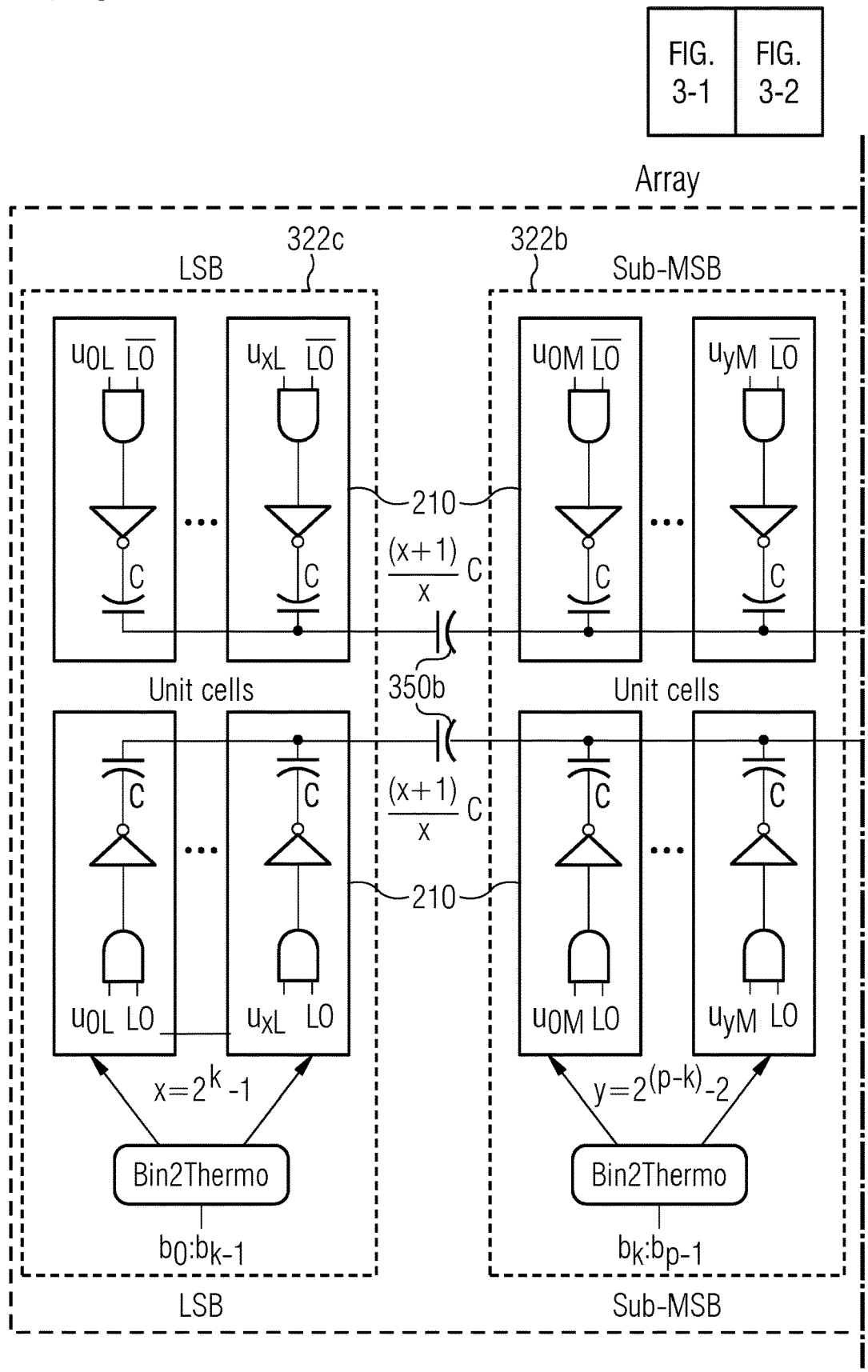

$Y1 \neq Y2$

SWITCHED CAPACITOR RADIO FREQUENCY DIGITAL POWER AMPLIFIER AND RADIO FREQUENCY DIGITAL-TO-ANALOG CONVERTER

FIELD

Examples relate to a switched capacitor digital power amplifier (DPA) or digital-to-analog converter (DAC), more particularly, a switched capacitor radio frequency (RF) DPA or RF DAC with segmentation of an array of switched capacitor cells.

BACKGROUND

A DPA enables wireless transmitters to operate with high efficiency. In order to support half-duplex operations as well as co-existence with other radios on the same platform or small form-factor device, the DPA is required to meet stringent out-of-band noise and spectral emissions. As an example, transmitters are required to meet a noise floor of better than −140 dBm/Hz while delivering an output of 20 dBm i.e. a power spectral density of −160 dBc/Hz. This includes an impact of all impairments in the system, such as phase noise and jitter, distortion, quantization noise, etc. The quantization noise contribution (the out-of-band noise of −160 dBc/Hz) requires a DPA amplitude quantization of better than 12 bits DPA. Emerging modes of operation in upcoming releases of Long Term Evolution (LTE) and Fifth Generation (5G) wireless communication standards include using the unlicensed WiFi spectrum to augment the cellular access (i.e., License Assisted Access (LAA)/enhanced LAA (eLAA), or the like). In these modes, the output power from the transmitter can be allowed to be greater than 30 dBm while still meeting the same absolute noise floor. In addition, the transmitter will be required to support a power control in a dynamic range of −60 dB while meeting the error vector magnitude (EVM) specifications of the highest modulation and coding scheme (MCS) modes. The result is that the DPA may need to support a quantization resolution of about 16 bits.

A DPA may not need to maintain the amplitude-to-amplitude modulation (AM-AM) and amplitude-to-phase modulation (AM-PM) linearity of this level of accuracy in a system incorporating digital pre-distortion (DPD). A low power polynomial or look-up-table (LUT) based pre-distorter can mitigate the non-linearity impairment as long as the AM-AM and AM-PM transfer functions are smooth (i.e. continuous and differentiable functions). However, even with DPD the root mean square (RMS) quantization differential non-linearity (DNL) sets the noise floor which can limit the out-of-band spectrum and/or the EVM at large power back-off. Therefore, it is needed to solve the quantization noise problem in DPAs especially for the applications mentioned above.

Digital power amplifiers may be implemented as arrays of switched capacitor cells. FIG. 1 shows a structure of conventional switched capacitor DPA for wireless communications. The DPA 100 comprises arrays 110 of switched capacitor cells 112 that drive a transformer or a power combiner 120. Each array 110 comprises a plurality of switched capacitor cells 112. The phase modulated local oscillator signal (MoLO) 130 is distributed to the entire array 110 and individual switched capacitor cells 112 either toggle with the local oscillator signal 130 or are grounded, and produce different amplitudes depending on the number of toggling cells. The switched capacitor array offers very good efficiency as well as acceptable linearity of output power with an input digital codeword. Furthermore, since each of the switched capacitor cells includes an inverter 114 that drives a capacitor 116, it is very amenable to scaling to advanced process technologies. The optimum size of the inverter 114 and the capacitor 116 depends on the required output power and may be determined by a load pull analysis. For a moderate (e.g. 8-10) number of digital codeword bits, a DPA may be realized as an array of identical unary-coded (thermometric-coded) cells, which offers a number of benefits such as good linearity and symmetry of design and layout. The challenge is to increase the resolution of the DPA to higher resolutions.

One way to increase the resolution of a DPA is to use more unary-coded (thermometric-coded) cells. However, each extra bit will require doubling the number of cells in the unary-coded array and hence the area of the array and the power dissipation in the decoder and driver chain. This approach to increase the resolution will result in a prohibitive efficiency penalty. This is especially true beyond 10-bit resolution. For example, in order to implement such a DPA for the eLAA mode, it needs to support a resolution of 16-bits, and implementing the DPA as a unary array for this case will require 65,536 switched capacitor cells, which is impractical.

Another approach is to segment the DPA into unary-coded cells and binary-coded cells. The binary-coded cells are scaled down versions of the unit unary-coded cells but this results in unit cells with very small devices and capacitors. A limitation of the binary segmentation approach is that scaling down the cell size runs into processing technology limitations. The current processing technology allows only discrete transistor dimensions. Furthermore, a switched capacitor array ranging from small to large unit capacitance suffers from matching problems (impacting DPA linearity). The smallest capacitors also suffer from increased sensitivity to parasitic capacitors. Considering the eLAA example, implementing the 16-bit resolution will require scaled cells with capacitors in the range of 0.2 fF to 100 fF, which is too difficult to maintain the performance.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
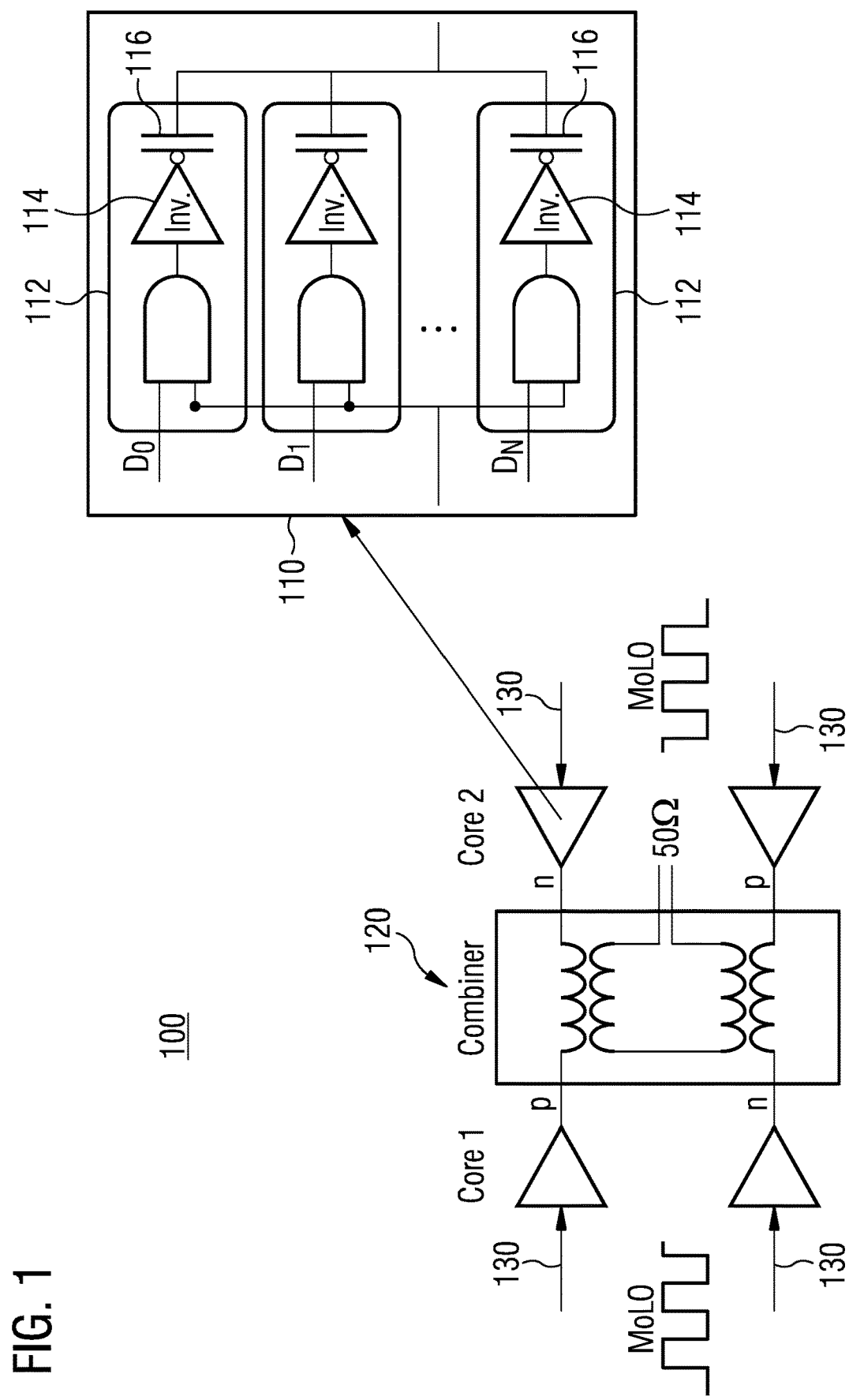
FIG. 1 shows a structure of conventional switched capacitor DPA for wireless communications.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality.

Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

The examples disclosed herein allow a DPA to be scaled to any resolution, especially higher number of digital codeword bits, (e.g. 16 bits). The examples may use identical switched capacitor cells with all the linearity and layout benefits but achieve high resolution without increasing the total number of switched capacitor cells prohibitively. As a result, the DPA can achieve high resolution with high efficiency and small area.

In some examples disclosed herein, a switched capacitor array of a DPA/DAC may be segmented into a plurality of sub-arrays of identical unary-coded switched capacitor cells, and the outputs of the sub-arrays are combined using an appropriately-weighted series capacitor(s).

In the examples, since a design of a single unit cell would be sufficient, the design process for a DPA/DAC would be simplified. Moreover, the DPA structure in the examples minimizes the total number of unit cells required for a specified DPA resolution resulting in smaller area and higher efficiency. The DPA structure in the examples also provides a simple path to extending the DPA to any resolution and enables easy support for future updates to the protocol that may include tougher spectral emissions mask requirements.

Hereafter, examples will be explained with reference to an RF DPA, but the examples are also applicable to an RF DAC. The same structure of the RF DPA in the examples disclosed herein can be used for an RF DAC. The examples will be explained with reference to a certain resolution (e.g. a 16-bit resolution) and a certain segmentation scheme (e.g. partition into two, three, or four segments and resolution of each segment, etc.). However, it should be noted that the examples are provided just for illustration purposes, not as a limitation, and are completely general and may be applied to any resolution and segmentation schemes. The examples may be adapted for any other configurations to optimize for the total number of switched capacitor cells, power consumption and efficiency, linearity, modes of operations, or the like.

Figure 2:
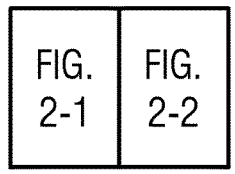
FIG. 2 shows an example DPA architecture.
Figure 1:
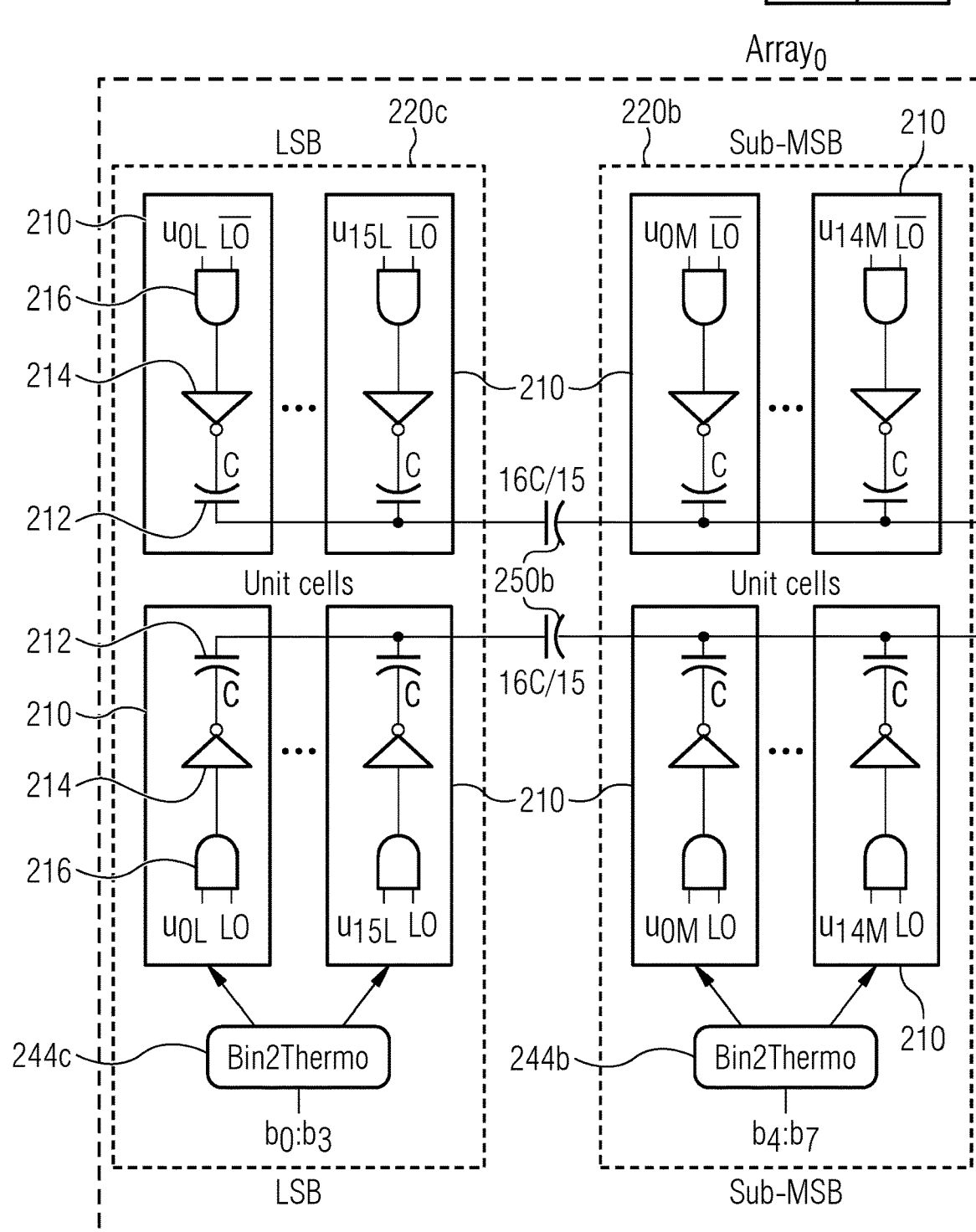
Figure 2:
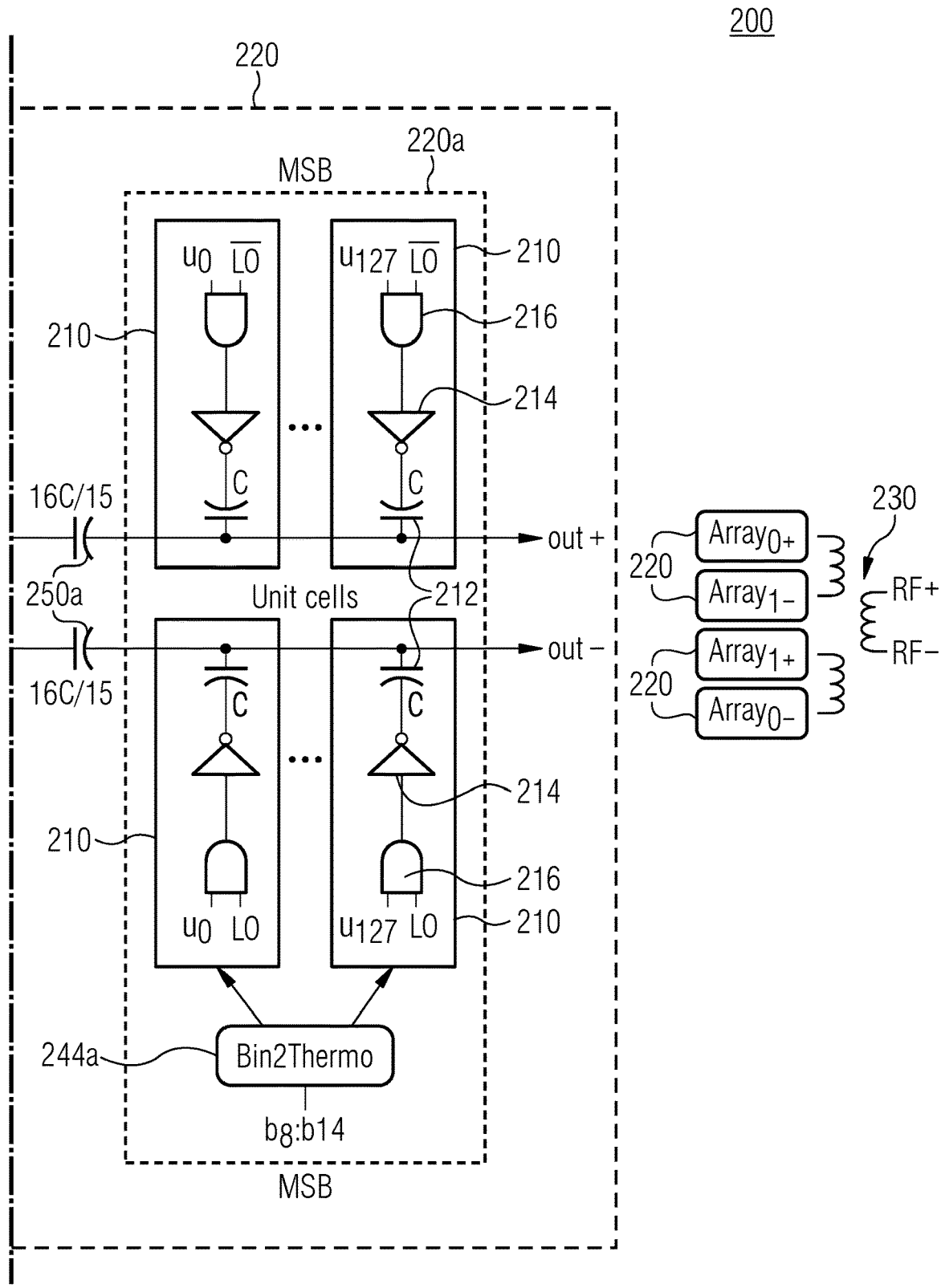

FIG. 2 shows an example DPA structure. The DPA 200 may include a plurality of switched capacitor cells 210 that may be grouped into one or more arrays 220. The DPA 200 may additionally include a power combiner 230 (e.g. a transformer), and the arrays 220 of switched capacitor cells may drive the power combiner 230. A switched capacitor cell 210 comprises a capacitor 212 at the output and an inverter 214 (i.e. a switch) connected to the capacitor 212 in series. The local oscillator (LO) signal 240 drives the inverter 214 and the inverter 214 drives the capacitor 212. For example, the local oscillator signal 240 may be a signal from a local oscillator driven from a phase locked loop (PLL) or any other locked signal source.

In this example, the total switched capacitor cells 210 may be grouped into multiple arrays 220 (e.g. array 0 and array 1 in FIG. 2). Each array 220 may include groups of switched capacitor cells to generate differential outputs. The RF output of the DPA 200 may be obtained by combining the outputs of the arrays 220 in the power combiner 230.

In one example, each array 220 of switched capacitor cells is further segmented into sub-arrays 222a-222c of switched capacitor cells. FIG. 2 shows segmenting the switched capacitor cells into three segments, (i.e. a most significant bit (MSB) segment 222a, a sub-MSB segment 222b, and a least significant bit (LSB) segment 222c). The example of FIG. 2 shows a four-bit LSB segment 222c, a 4-bit sub-MSB segment 222b, and a 7-bit MSB segment 222a, but the number of segments of the array may be two, three, or greater than three, and the number of assigned digital codeword bits for each segment may be configured differently. The example DPA in FIG. 2 may provide a 16-bit resolution including 1-bit resolution at the power combiner 230 by controlling each array 220. In this example, all switched capacitor cells 210 of the DPA use a unit capacitor of C and all switched capacitor cells 210 in each segment 222a-222c are unary-coded. Unary coding (also called as thermometer code) is an entropy encoding that may represent a natural number n with n ones (1s) followed by a zero or with n−1 ones (1s) followed by a zero.

Digital codeword bits assigned for each segment is encoded by a corresponding encoder 224a-224c (e.g. binaryto-unary encoding). Each of the unary-coded bits 244 of the digital codeword bits and the LO signal 240 are input to each AND gate 216 in the switched capacitor cell 210. Depending on the unary-coded bits 244, the inverter 214 operates in one of two modes: (i) the inverter 214 toggles at the LO rate in which case the inverter 214 delivers an RF power to the output, or (ii) the inverter 214 is static (e.g. shorted to the power supply or ground) in which case the inverter 214 delivers no RF power.

In an ideal case, the impedance seen by the inverter 214 in each switched capacitor cell 210 would be identical irrespective of whether any other switched capacitor cells 210 are toggling or shorted. The same also holds for the impedance seen at the power combiner 230. In order to deliver a desired power into the load, the power combiner 230 and the switched capacitor array 220 may be designed to transform the load impedance into an optimal impedance at the inverter output. This may be determined through load pull evaluations. For good efficiency in delivering the RF power, the impedance seen at the drain of the inverter should be the optimal impedance at the RF frequency but should be a high impedance at odd harmonics (e.g. third harmonic). This ensures that the inverters 214 in the switched capacitor cell 210 produce rail-rail square waves at their output independent of the output power.

A series capacitor 250 is inserted in series between two adjacent sub-arrays in order to provide appropriate weights to their outputs. Weighting is achieved by scaling the value of the series capacitor 250.

It should be noted that equations, mathematical expressions, numerical values including the capacitance, and the like described in the drawings and the description are provided as examples with reference to the specific segmentation schemes in the examples and may be set differently depending on the segmentation schemes or configuration of the arrays and sub-arrays. For example, the segmentation schemes disclosed herein may include a dummy branch in the sub-MSB or LSB sub-array and the series capacitor between the sub-arrays may be the same to other capacitors instead of 16/15C.

Figures 2, 3:
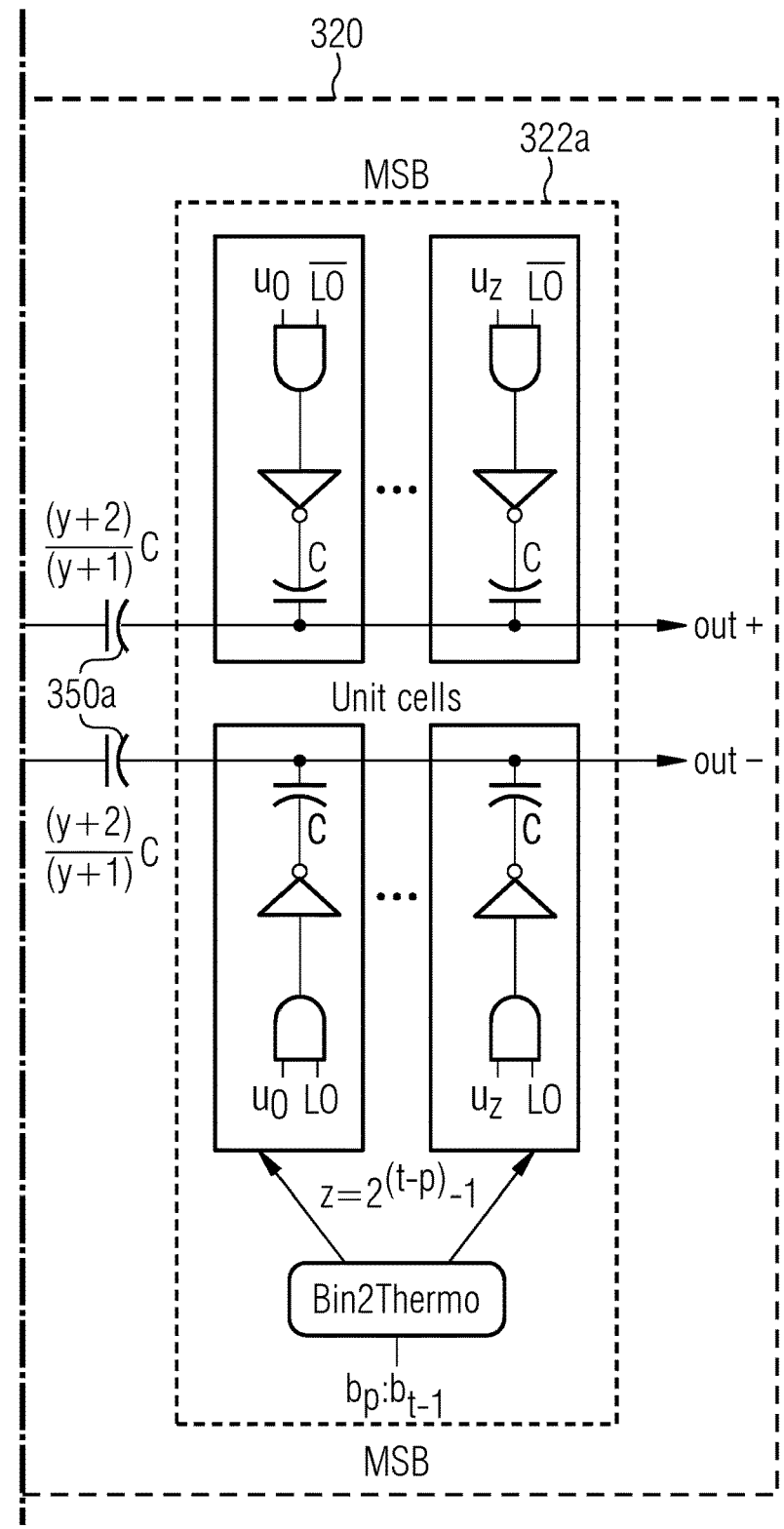
FIG. 3 shows an example of general case of segmenting an array of switched capacitor cells into sub-arrays of unary-coded cells.

FIG. 3 shows an example of general case of segmenting an array of switched capacitor cells into sub-arrays of unary-coded cells. In this example, the array 320 is segmented into three sub-arrays, (i.e. an LSB segment 322c for k LSBs of the codeword, a sub-MSB segment 322b for the next (p-k) bits of the codeword, and an MSB segment 322a for the (t-p) MSBs of the codeword), where k, p, t are integers, and series capacitors 350a, 350b are inserted in series between the sub-arrays 322a-322c. All switched capacitor cells 310 of the DPA use a unit cell capacitor of C and all switched capacitor cells 310 are unary-coded. A k-bit LSB sub-array 322c (i.e. a segment) comprises $x=2^k-1$ unary-coded switched capacitor cells, a (p-k)-bit sub-MSB sub-array 322b comprises $y=2^{p-k}-2$ unary-coded switched capacitor cells, and a (t-p)-bit MSB sub-array 322a comprises $z=2^{t-p}-1$ unary-coded switched capacitor cells. In order to scale the k-bit LSB sub-array 322c to fit the LSB of the (p-k)-bit sub-MSB array 322b, the series capacitor 350b needs a value of $C \cdot (x+2)/(x+1) = C \cdot 2^k/(2^k-1)$. In order to scale the (p-k)-bit sub-MSB sub-array 322b to fit the LSB of the (t-p)-bit MSB array 322a, the series capacitor 350a needs a value of $C \cdot (y+2)/(y+1)$.

The DPA architecture in the examples of FIGS. 2 and 3 uses identical unit switched capacitor cells in each sub-array. This results in minimal design effort since only one basic unit cell needs to be designed during the load pull optimization. In addition, it does not run into practical processing limits on the smallest realizable device and the matching and parasitic sensitivity of the small capacitors in the conventional binary array. It also requires a much smaller number of unit cells compared to the thermometric array without segmentation. This simplifies the decoder, reduces the array area, and improves efficiency by reducing the power consumption of the power amplifier drivers. The partitioning of an array into sub-arrays is very flexible and can be optimized for optimum component values, linearity, and efficiency. The resolution may be extended to any number of bits.

For a 16-bit resolution (e.g. for eLAA), the DPA may be partitioned into two sub-arrays of 8-bits each. In this case the DPA may need a total of 2×256=512 unit cells with a series capacitor of C·256/255. Alternatively, the DPA may be split into four sub-arrays of 4-bits each resulting in a total of 64 cells and a series capacitor of C·16/15. An array may be partitioned either uniformly or non-uniformly. For example, if a DPA is split into three arrays whose outputs are combined using a switched transformer (as shown in FIG. 2), the transformer may provide 1-bit of resolution since each array can be independently controlled. In order to obtain the remaining 15-bits of resolution from the array, the array may be split into a 7-bit MSB sub-array, a 4-bit next significant bit sub-array, and a 4-bit LSB array. As a result, a total of (16+16+128)×2=320 unit switched capacitor cells may be needed. This is much smaller than the 65,536 cells that would be required with a brute-force thermometric implementation.

The DPAs/DACs in the examples disclosed herein operate differently from the baseband DACs. Baseband DACs combine the charges from the capacitor array and for this operation to be linear the summing node needs to be a low impedance node (i.e. a virtual ground). The op-amp circuit provides this low-impedance over some finite bandwidth (set by the gain-bandwidth of the op-amp) in order to draw the charge into the output node. The DPAs/DACs in the examples disclosed herein may operate at GHz frequencies. However, op-amp-like circuits typically cannot operate at such high frequencies to present such a virtual ground. Furthermore, the objective of the DPAs in the examples is to deliver a specific power into the load (not just a charge/voltage) with good efficiency. The inverters in unit cells should see square waves at the drain node for good power efficiency even as the output power delivered is swept by changing the number of toggling cells. In order to achieve this, the capacitance in the unit cells and the inductance of the power combiner (e.g. a transformer) may be sized to present an optimum impedance at the fundamental RF frequency but a high impedance at the other odd harmonics and low impedance at even harmonics. In order to achieve high output power, the DPA and capacitors may be big and may therefore experience smaller random mismatch. The random mismatch and capacitor bottom plate parasitics contribute to the integral non-linearity (INL) of the DPA but may be suppressed through feedback receiver-based loop-back calibration or digital pre-distortion.

Figure 4:
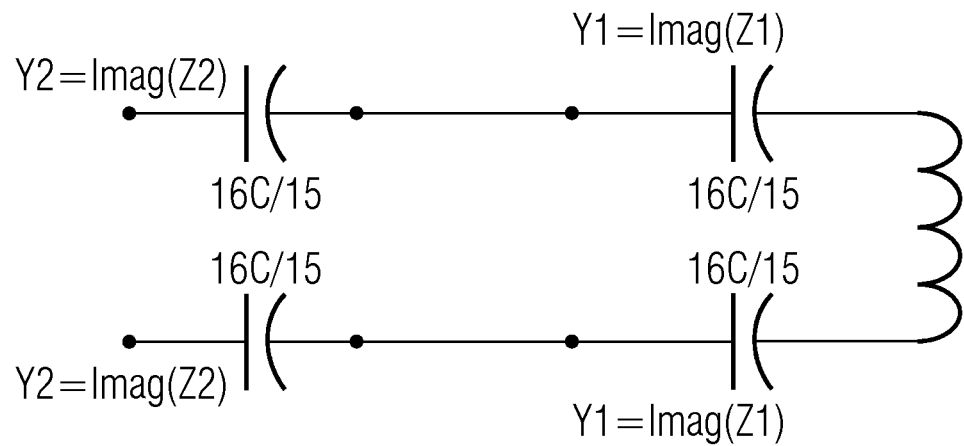
FIG. 4 shows admittance mismatch in a unary-unary segmented array.
Figure 4:
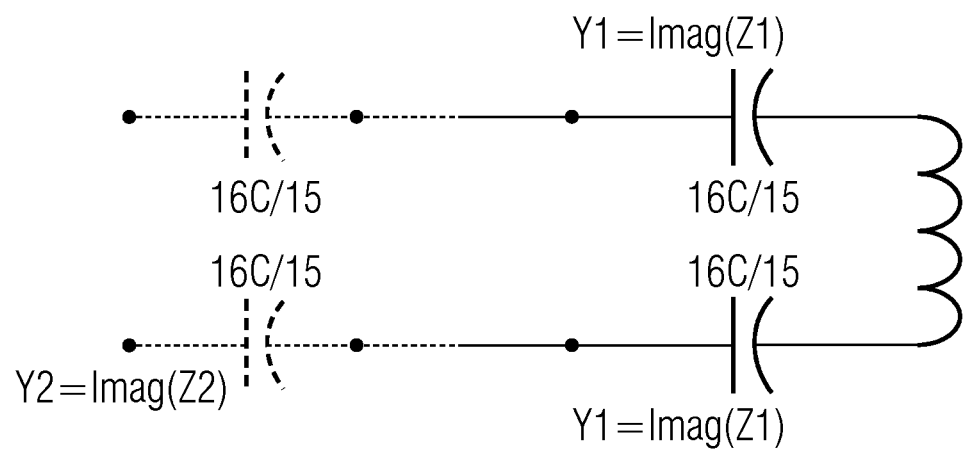

As shown in FIGS. 2 and 3, the segmentation results in a series-parallel network, and the impedance of the power combiner transforms to different reactance for different sub-arrays. FIG. 4 shows admittance mismatch in a unary-unary segmented array. The impedance mismatch in the example of FIG. 2 results from the series capacitor 250a-250b for segmentation. All the inverters in the unit switched capacitor cells of each sub-array see the same impedance but the inverters in different sub-arrays see different impedances. This causes amplitude-to-phase discontinuity and non-linearity due to different waveform shapes at the drain nodes and different group delays between the sub-arrays. The equivalent series resistance (ESR) of the series capacitors also aggravates the phase linearity.

DPAs are typically incorporated into systems with digital signal pre-distortion. The non-linearity resulted from the segmenting is not smooth since the switch from one sub-array to the next results in a jump (discontinuity) in the phase. This increases digital pre-distortion (DPD) complexity, increases power consumption in the DPD due to higher clock rate, and aggravates the EVM performance. The examples disclosed herein provide a solution for this issue, which will be explained below.

The switched capacitor DPA controls the output voltage by the ratio of capacitors. The inverters in the switched capacitor cells of the DPA are driven by a phase-modulated LO signal. Therefore, a fixed capacitor ratio for the subsequent stages is important to maintain AM-AM and AM-PM linearity of the power amplifier. An identical unit switched capacitor cell makes it easier to maintain the desired capacitor ratio because the same cell can be re-used.

Figure 5:
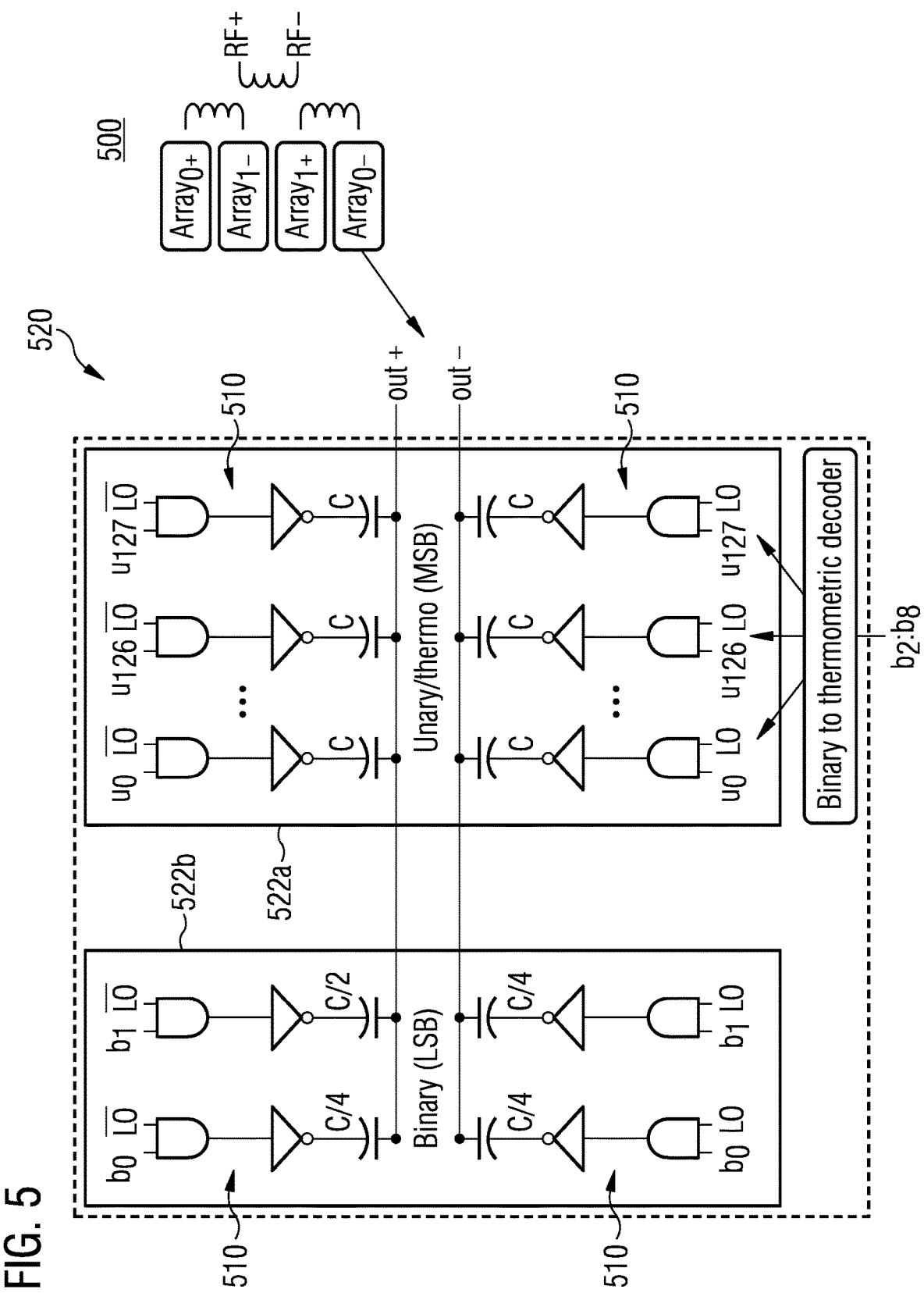
FIG. 5 shows a typical implementation of a conventional 10-bit DPA employing a binary-coded segment.

FIG. 5 shows a typical implementation of a conventional 10-bit DPA 500 employing a binary-coded segment. In this example, the switched capacitor cells 510 are partitioned into a binary-coded segment 522b for two LSBs and a unary-coded segment 522a for 7 MSBs. The binary-coded segment 522b has a scaling factor of 2 for each subsequent stage.

In this example, extending the 10-bit array (9 bits array+1 bit resolution implemented at the combiner) to the 16-bit array (15 bits array+1 bit at the combiner) would require 6 more binary bits to be added if the unary bits are kept unchanged. In this case, it is difficult to maintain linearity. For example, as in a conventional DPA, a 61 fF of unit capacitor is used for the unary sub-array 522a, a minimum binary capacitor would be 61 fF/256=0.238 fF. This is problematic because the capacitor ratio would be significantly disturbed by the parasitic capacitance between the metal and the substrate, and it would be difficult to set the value of the capacitor to that finest precision under the current processing technology.

On the contrary, a unary array demonstrates superior linearity because the same unit cell is used throughout the whole unary array. However, even though the value of the unit capacitor does not change, the number of unary cells doubles for each extra bit. For instance, extending the afore-mentioned example of FIG. 5 to a 16-bit array by appending more unary bits would require a total of 16,384 cells (=$2^{14}$), which translates into 61 fF×16,384≈1 nF of total capacitance. In this case, it would also be difficult to distribute the LO signal with a reasonable power consumption. Adding unary cells would cause significant area (e.g. 64 times in the above example) and power consumption overhead.

In some examples, the binary-coded segment in FIG. 5 may be replaced with a C-2C segmented array. The C-2C architecture has several advantages over the conventional binary-coded DPA architecture. Firstly, the C-2C array uses the same unit cell throughout the array, which saves layout time and removes layout complexity for timing mismatch and other undesirable effects. Secondly, the size of the devices and the capacitors of C-2C array does not scale according to the resolution, which eliminates the boundary to what resolution it can be extended. Thirdly, the series 2C capacitor of C-2C array is an integer multiple of the unit capacitor C. Therefore, it is easier to maintain the fixed capacitor ratio.

Figure 6:
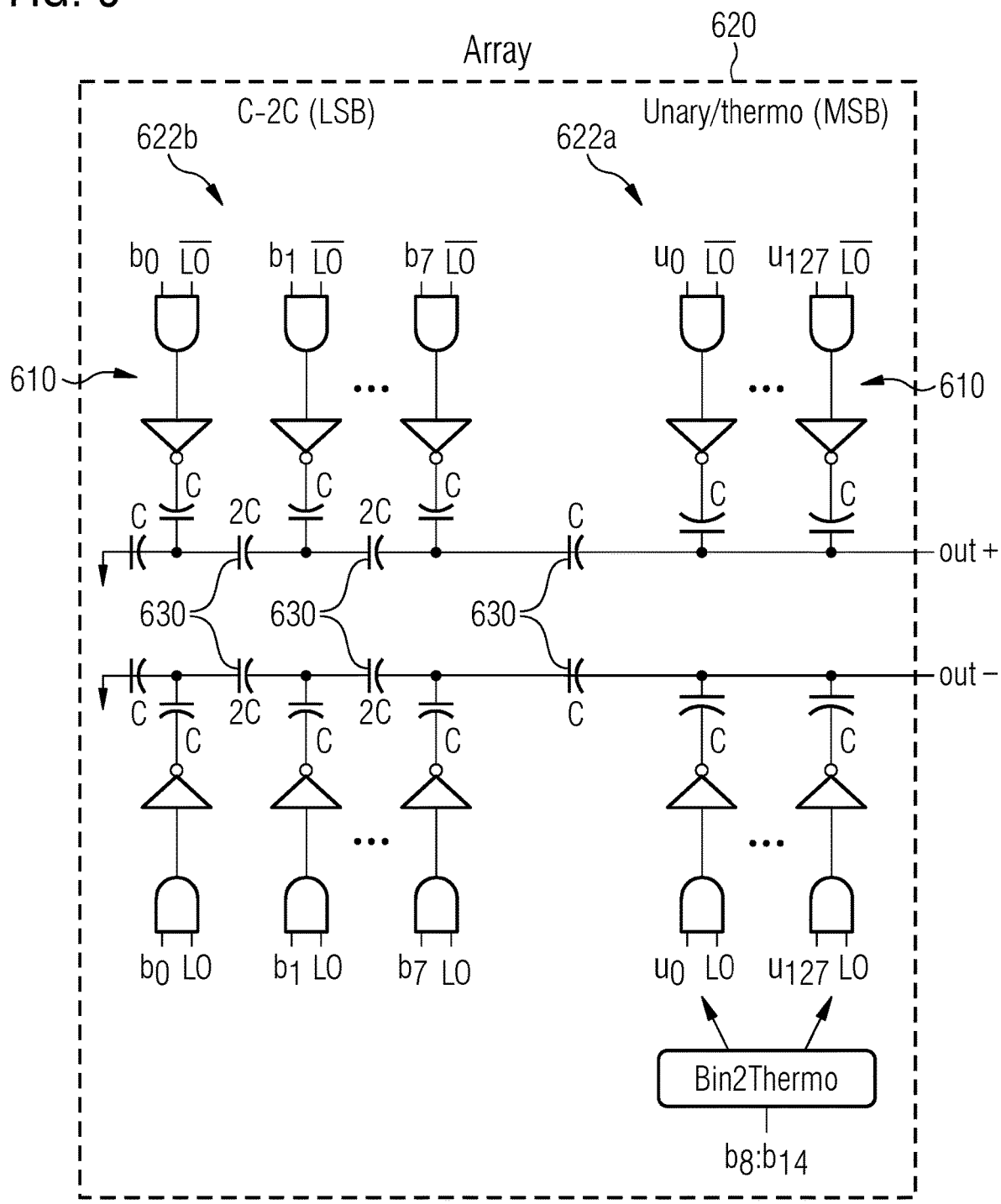
FIG. 6 shows an example of a 16-bit DPA using a C-2C-unary architecture.
Figure 7:
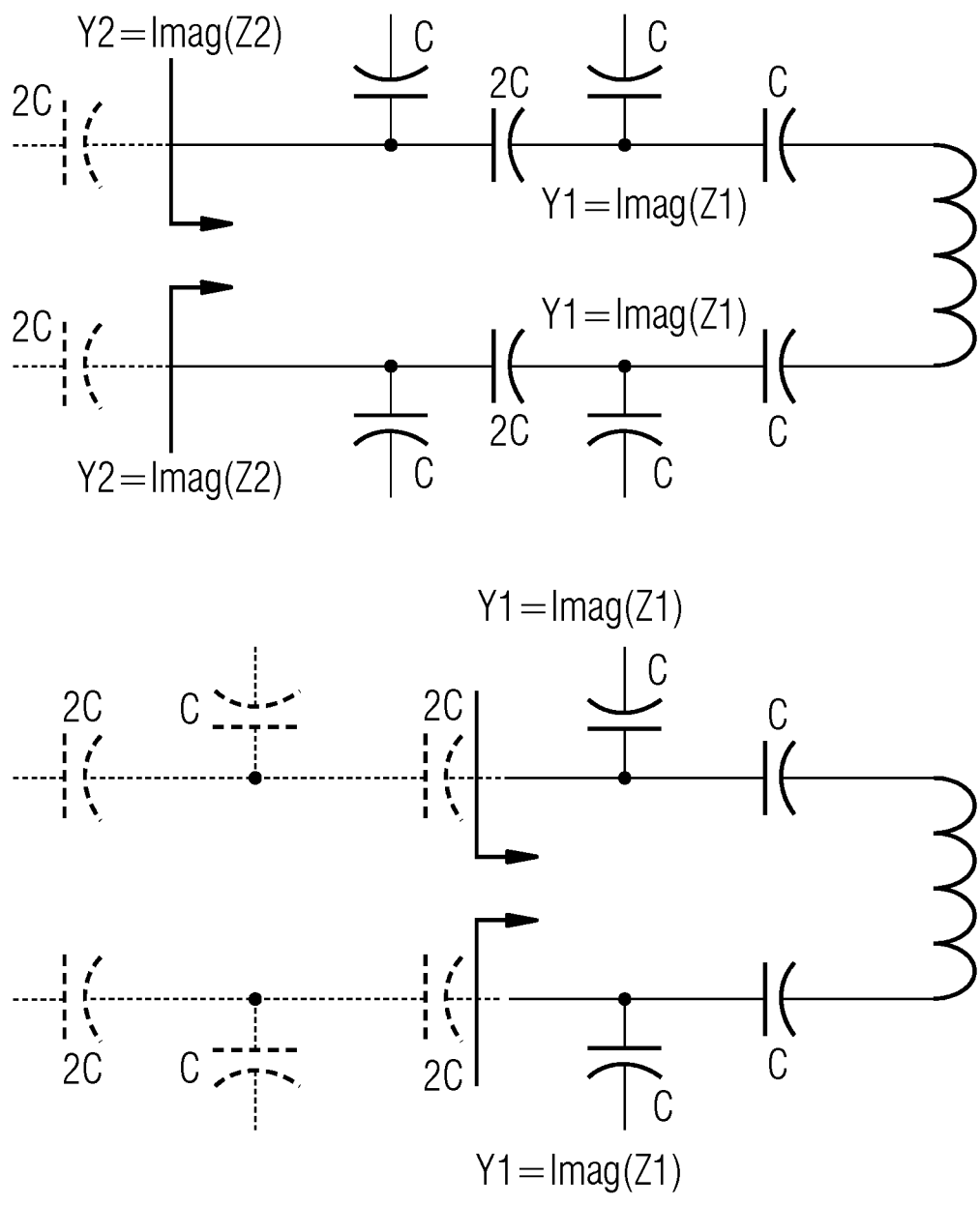
FIG. 7 shows admittance mismatch in the C-2C-unary segmented array.

FIG. 6 shows an example of a 16-bit DPA using a C-2C-unary architecture. In this example, an array 620 of switched capacitor cells 610 is partitioned into a C-2C sub-array 622b for 8 LSBs and a unary sub-array 622a for 7 MSBs. The C-2C sub-array 622b includes a plurality of unit switched capacitor cells 610 with unit capacitance C connected with series capacitors 630 of 2C as shown in FIG. 6. The C-2C sub-array 622b may use the same number of cells as in the binary-coded array. Therefore, it may not have any efficiency penalty. However, the C-2C sub-array 622b has n number of series 2C capacitors 630 for n number of C-2C LSB bits. The C-2C sub-array 622b offers better linearity performance than the binary-coded array, but may still suffer substantial amplitude-to-phase distortion because the admittance presented by the combiner at each node is different as shown in FIG. 7, and a finite ESR of the series capacitors 630 does not allow the voltage to stabilize instantaneously. FIG. 7 shows admittance mismatch in the C-2C-unary segmented array. As each bit goes through different series capacitors 630 in the C-2C sub-array 622b, the outputs of switched capacitor cells 610 face different delays. For instance, bit $b_0$ will suffer a maximum delay because it traverses through the maximum number of series capacitors 630.

In another example, an array of switched capacitor cells may be partitioned into multiple unary arrays, as shown in FIG. 2. In this unary-unary architecture, the same unit cells are used throughout the whole array. It offers approximately the same efficiency as the C-2C array with much improved AM-AM linearity performance. It has better phase linearity compared to the C-2C array due to a smaller number of series capacitors, but may still suffer phase discontinuity for the afore-mentioned reason, which needs to be addressed to meet the stringent EVM specifications.

Different switched capacitor DPA architecture has trade-offs between the efficiency and linearity. The binary-unary architecture has good efficiency but AM-AM and AM-PM non-linearity problems. The unary architecture without segmentation has good AM-AM and AM-PM linearity but has worst efficiency. The C-2C-unary architecture has good efficiency but AM-AM and AM-PM non-linearity issues. The unary-unary architecture has good efficiency and AM-AM linearity, but has AM-PM non-linearity issue.

In examples, in order to solve the AM-PM discontinuity issue in the segmented switched capacitor array, tunable phase compensation buffers may be inserted in the LO signaling path that drives each sub-array in the segmented switched capacitor array. The tunable phase compensation buffer may be added irrespective of whether it is segmented as unary-unary or C-2C-unary structure. The phase correction scheme disclosed herein may be applied to any high resolution DPA regardless of the segmentation structure, e.g., C-2C, unary, or binary. The tunable phase compensation buffer improves linearity, and with the phase compensation buffers, the switched capacity array may be segmented in any number of times with good linearity and efficiency.

Figures 1, 8:
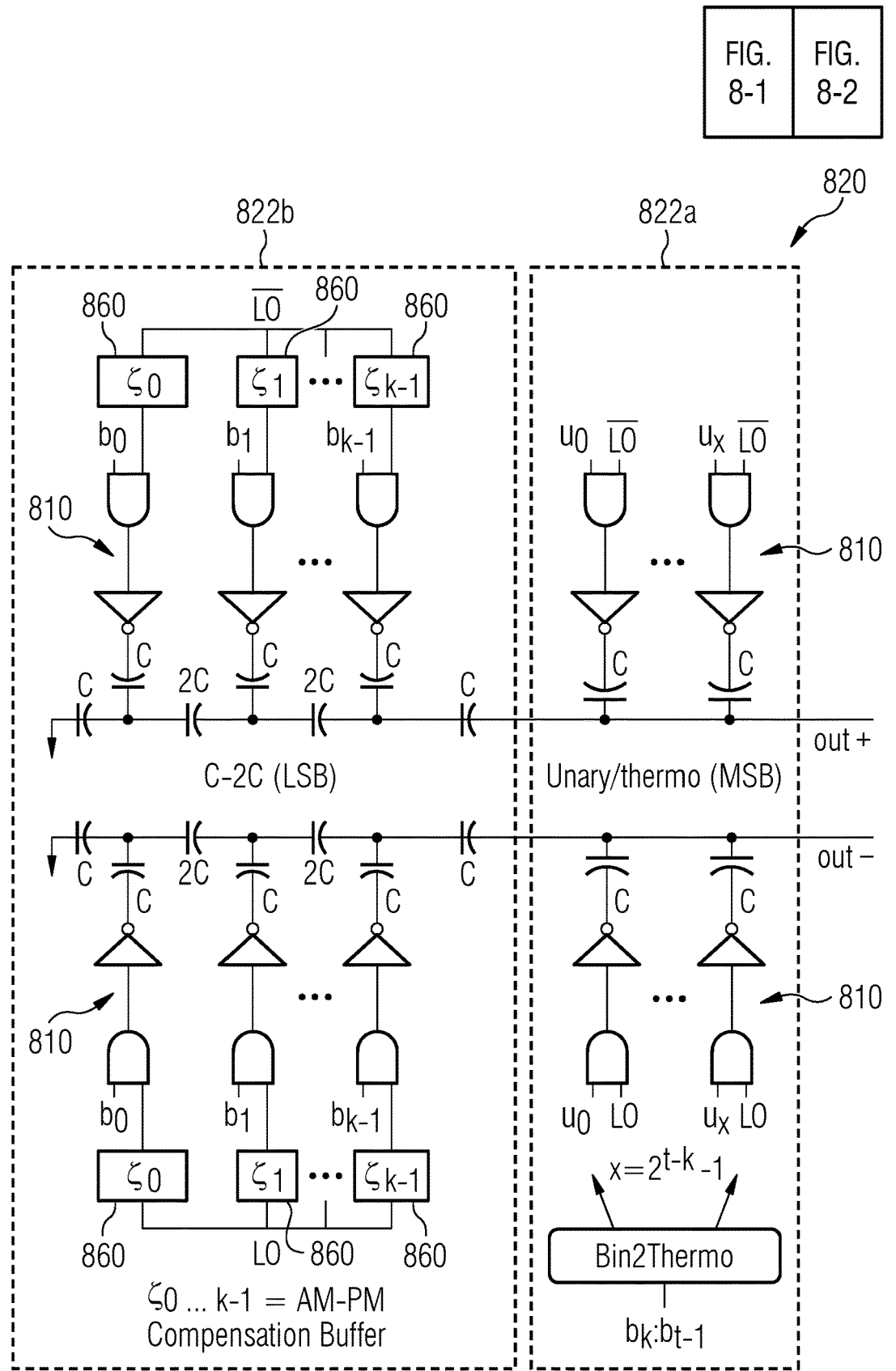
FIG. 8 shows an example of adding phase compensation buffers to a generic C-2C-unary architecture.
Figures 2, 8:
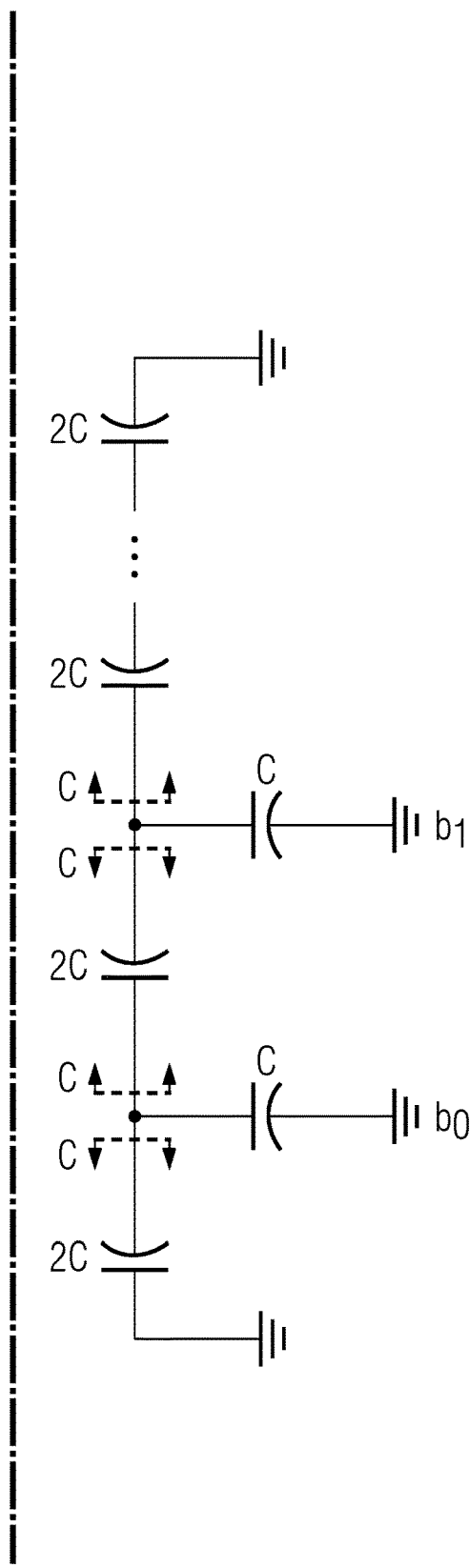

FIG. 8 shows an example of adding the phase compensation buffers 860 to a generic C-2C-unary array. In this example, an array 820 of switched capacitor cells 810 is sub-divided into k bits of C-2C sub-array 822b and (t-k) bits of unary sub-array 822a. In order to solve the amplitude-to-phase distortion issue in the C-2C sub-array as explained above, for the k bits of C-2C sub-array 822b, k number of phase compensation buffers 860 may be added in the LO signaling path for the k-bits of C-2C LSBs in the C-2C sub-array 822b such that the LO signals to each switched capacitor cell 810 in the C-2C sub-array 822b are delayed appropriately to remove the phase discontinuity.

In the C-2C sub-array 822b, a voltage is divided into half at each successive node because of a capacitance C presented from both sides (shown on the right side of FIG. 8). Total capacitance seen from the node where the C-2C sub-array 822b connects to the unary sub-array 822a is C. Therefore, the whole C-2C sub-array 822b works as one cell out of $(2^{(t-k)}-1)$ unary cells. The normalized output voltage for a t-bit array with a k-bit C-2C sub-array can be calculated as:

$$v = \frac{\sum_{r=0}^{k-1} \frac{b_r}{2^{k-r}} \left(1 + \sum_{s=0}^{x-1} u_s\right)}{2^{t-k}},$$

Equation (1)

where, $b_0, b_1, \ldots, b_{k-1}$ are the Boolean values for the binary bits (i.e. '1' or '0') and $u_0, u_1, u_2, \ldots, u_x$ are the corresponding Boolean unary values depending whether the particular bit is 'ON' or 'OFF.' For instance, an 8-bit codeword ($b_0$='1', $b_1$='1', $b_2$='1', \ldots, $b_7$='1', $b_8$='0') for a 16-bit array segmented as a 9-bit binary sub-array and a 7-bit unary sub-array (k=9, t=16) in the example of FIG. 6 would corresponds to:

$$v = \frac{\frac{255}{512}(1+0)}{128} = \frac{255}{65536}.$$

Figures 1, 9:
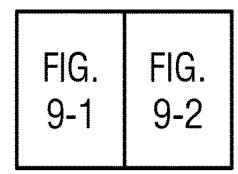
FIG. 9 shows an example of adding phase compensation buffers to a generic unary-unary architecture.
Figure 9:
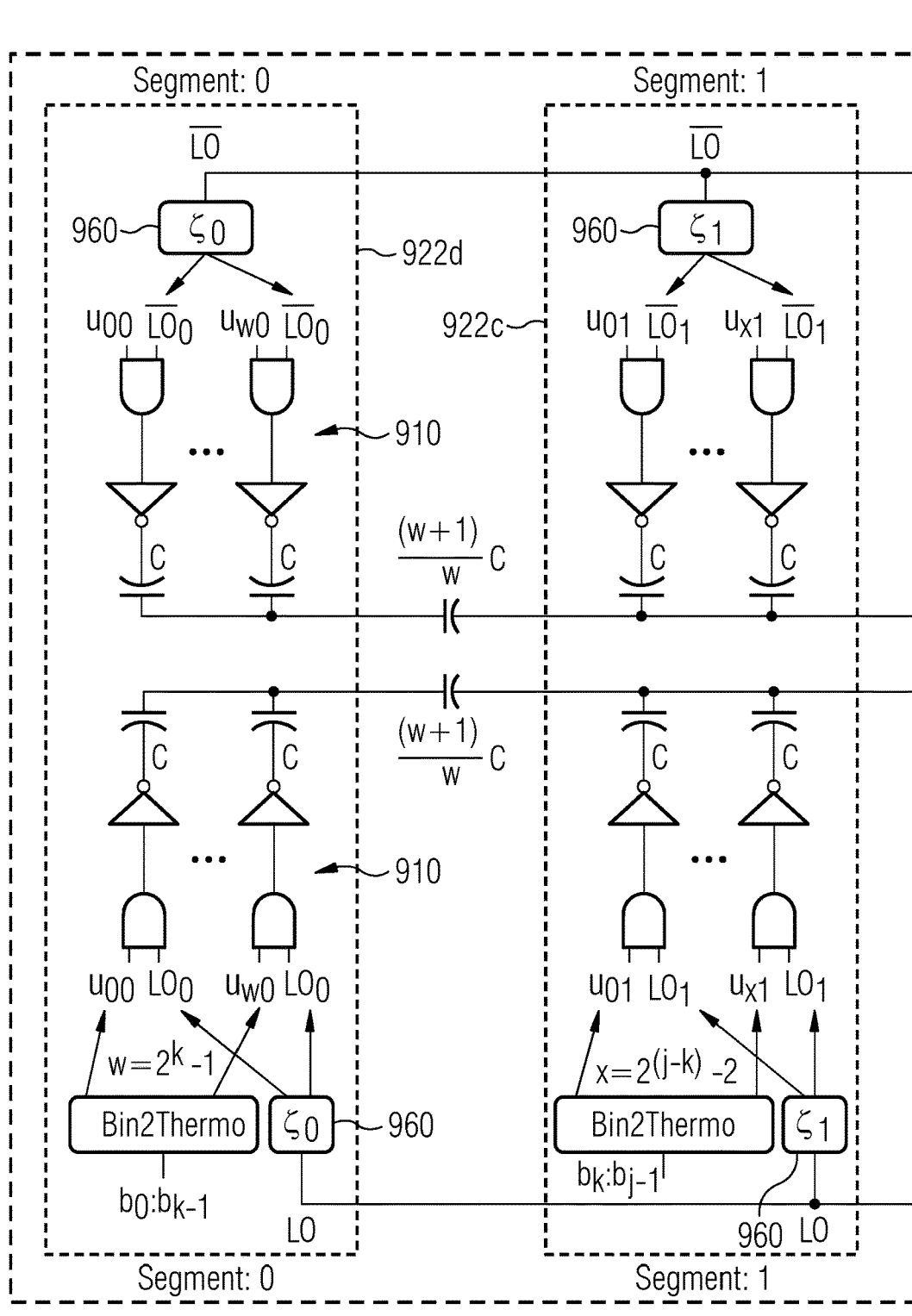
Figures 2, 9:
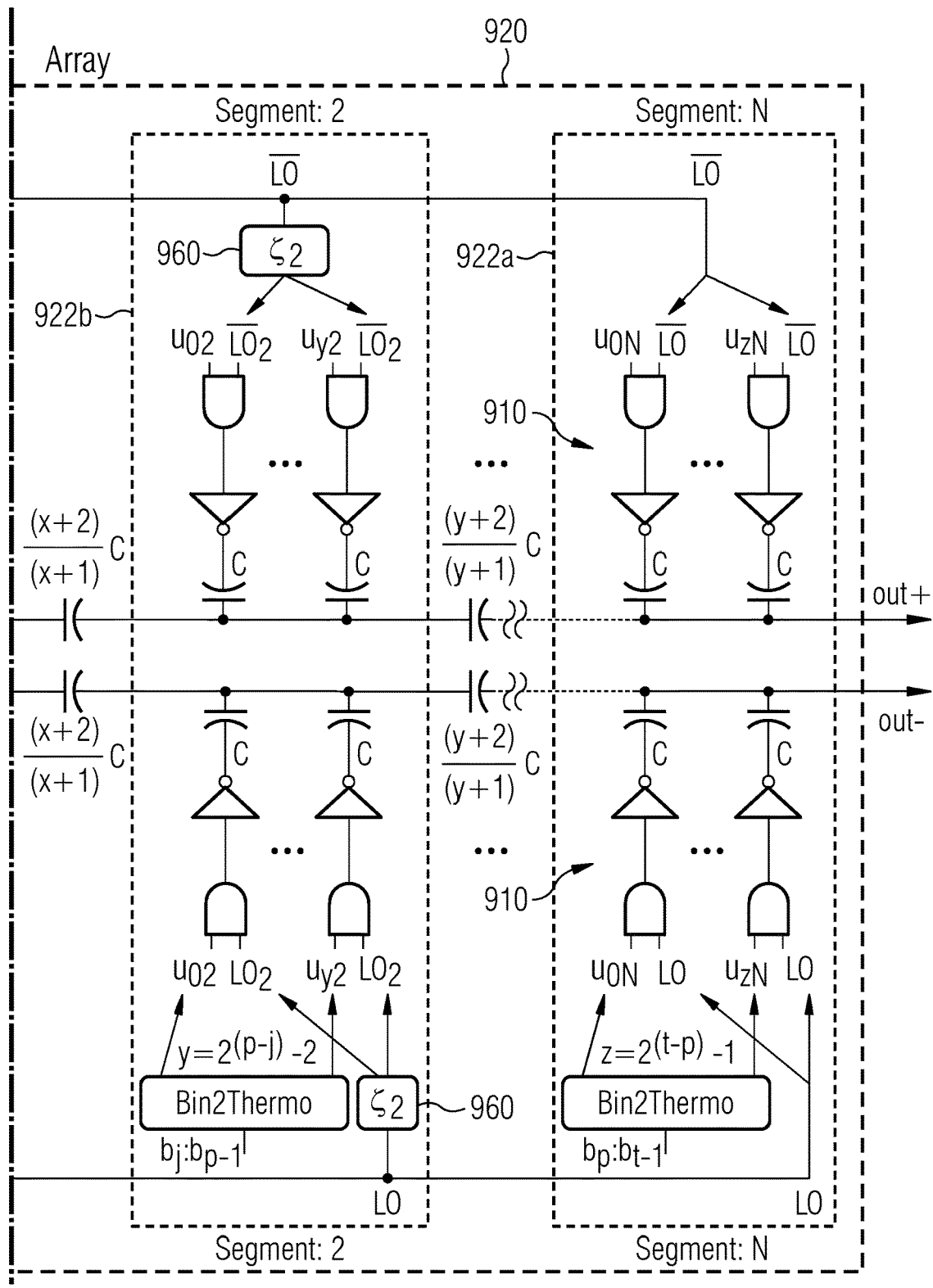

FIG. 9 shows an example of adding the phase compensation buffers 960 to a generic unary-unary array. In this example, an array 920 of switched capacitor cells 910 is sub-divided N times (N=3 in this example) into k bits of unary sub-array 922d, (j-k) bits of unary sub-array 922c, (p j) bits of unary sub-array 922b, and (t-p) bits of unary sub-array 922a. In order to solve the amplitude-to-phase discontinuity issue of the segmented unary array, as explained above, N number of phase compensation buffers 960 (one for each segment) may be added in the LO signal path for the N lower-significance sub-arrays 922b-922d such that the LO signals to the sub-arrays 922b-922d are delayed appropriately to remove the phase discontinuity between sub-arrays. In the unary-unary architecture as shown in FIG. 9, the delay settings are common within each sub-array but different for different sub-arrays.

The output normalized voltage can be calculated as:

$$v = \frac{\left(\sum_{m=0}^{w} u_{m0}\right) \cdot \left(1 + \sum_{n=0}^{x} u_{n1}\right) \cdot \left(1 + \sum_{r=0}^{y} u_{r2}\right) \cdots \left(1 + \sum_{s=0}^{z-1} u_{sN}\right)}{2^k \cdot 2^{j-k} \cdot 2^{p-j} \cdot 2^{t-p}}$$

Equation (2)

where, u is the corresponding Boolean unary values (i.e. '1' or '0') for binary codes b depending whether the particular bit is 'ON' or 'OFF' and N is the number of segmentation. For example, if a 16-bit array is segmented 4 times (N=4) as 4 bits/4 bits/4 bits/4 bits, the value of v corresponding to half codeword would be:

$$v = \frac{\left(\sum_{m=0}^{15} u_{m0}\right) \cdot \left(1 + \sum_{n=0}^{14} u_{n1}\right) \cdot \left(1 + \sum_{r=0}^{14} u_{r2}\right) \cdot \left(1 + \sum_{s=0}^{14} u_{s3}\right)}{2^4 \cdot 2^4 \cdot 2^4 \cdot 2^4} =$$

$$\frac{16 \cdot 16 \cdot 16 \cdot 8}{65536} = \frac{32768}{65536} = \frac{1}{2}.$$

Equation (3)

Typically, the segmentation number N would be much smaller than the total number of bits tin the array. For Instance, if the array is segmented into three segments, two compensation buffers would be needed for the two lower sub-arrays. It is easier to provide a smooth phase transition between segments for fewer compensation buffers over the whole range of process corners and temperature.

Figure 10:
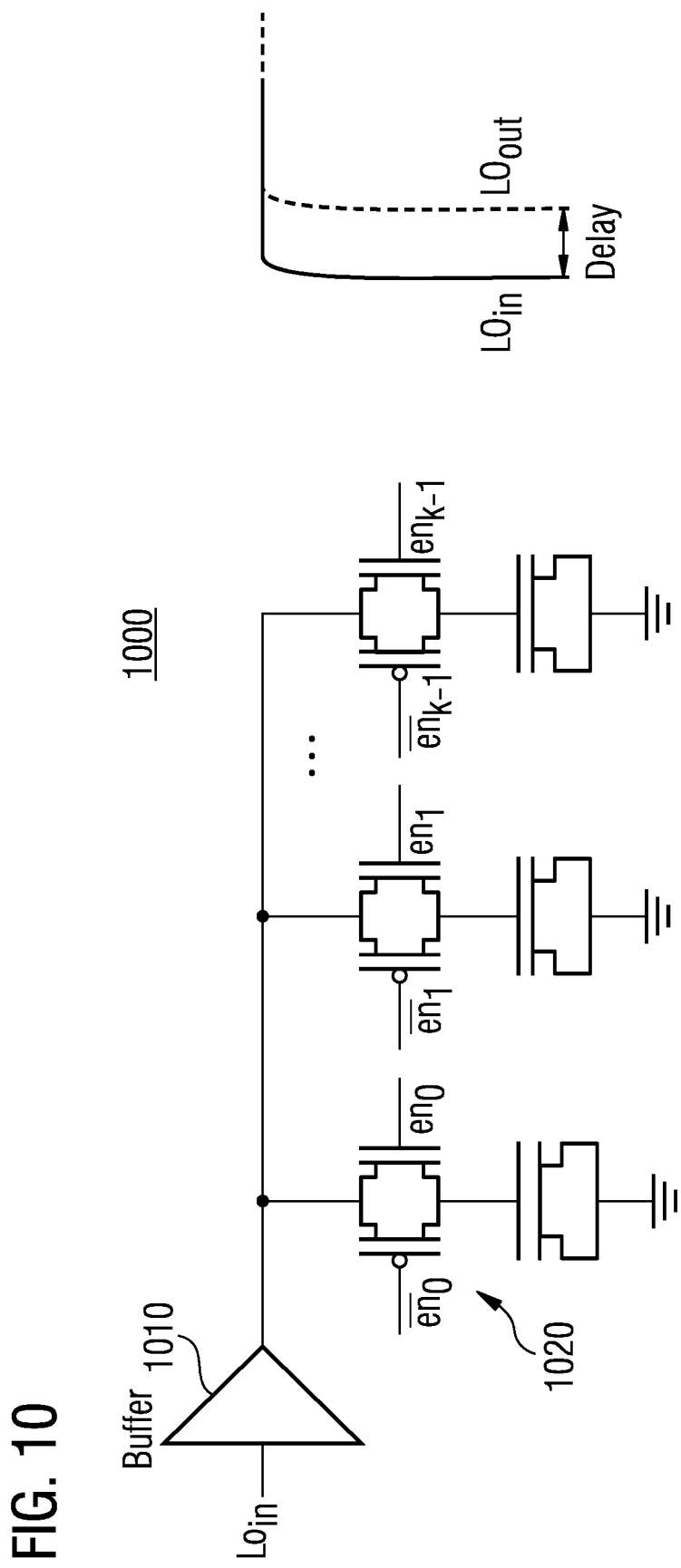
FIG. 10 shows an example tunable phase compensation buffer.

FIG. 10 shows an example tunable phase compensation buffer. FIG. 10 is just an example, and any other type of delay compensation buffers can be used. The phase compensation buffer 1000 may include a buffer 1010 (e.g. two inverters connected in series) with switchable load capacitors 1020 connected in parallel to the buffer 1010 for delaying the input LO signal to each switched capacitor cell or to each sub-array. The phase compensation buffer 1000 operates by controlling the RC delay. A transmission gate controlled by the digital bits ($en_0, \ldots, en_{k-1}$) may enable the metal-oxide-semiconductor capacitors (MOSCAPs) individually, therefore increasing the RC delay. Overall power consumption of the buffer may not have any noticeable impact on efficiency while it provides delay correction step size (e.g. 250 fs) with total range in the order of few pico-seconds.

Since the delay is sensitive to process-voltage-temperature (PVT) it may be set through the same loopback calibration with the feedback receiver that will typically be used to measure the AM-AM and AM-PM nonlinearity of the DPA. This improves discontinuities in the AM-PM characteristics. It may allow the DPD to operate at a lower rate than the RF frequency and hence facilitates the array to be segmented multiple times with good linearity and efficiency.

The phase compensation scheme in the examples improves the overall phase linearity by removing the discontinuity in phase. Therefore, it significantly simplifies the digital pre-distortion (DPD) algorithm. Smoother phase facilitates the DPD to run at a lower rate without affecting the EVM specification or improves EVM if run at the same clock rate, hence improving the overall EVM and efficiency especially at back-off.

Figures 11A, 11B:
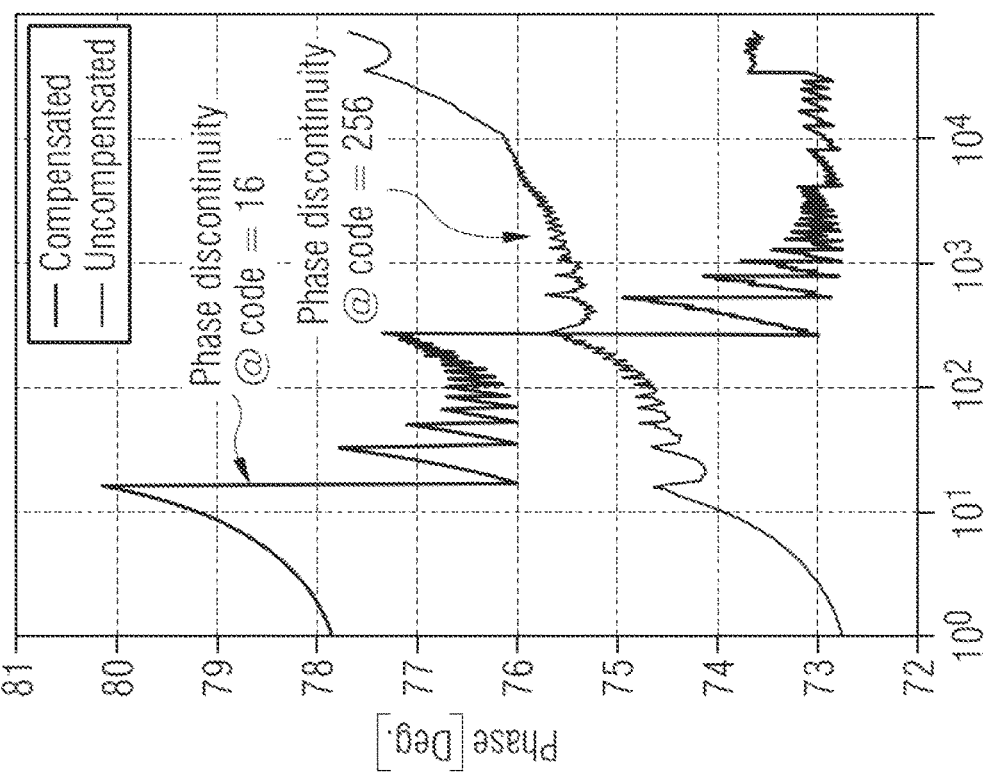
FIGS. 11(A) and 11(B) show simulation data for the 3-segment 16-bits array with and without phase compensation.

FIGS. 11(A) and 11(B) show simulation data for the 3-segment 16-bits array segmented as 4bits-4bits-7bits+1bit (power combiner) unary sub-arrays with and without phase compensation. Without phase compensation, phase discontinuity is observed for each segmentation, which is replicated over the whole range. This causes EVM to degrade specially at the lower codes. FIGS. 11(A) and 11(B) show enhancement of the phase linearity with the phase compensation.

The examples disclosed herein enable the resolution to be increased up to the noise floor limit. The examples would enable the DPA to meet the DPA specifications for eLAA and future modes of operations with even tighter spectral mask requirement. The switched capacitor array may be segmented any number of times with good linearity, which saves area and improves efficiency significantly.

Higher resolution is required for out-of-band spectral mask requirement for eLAA and other future operations. The resolution of the switched capacitor DPA can be increased by the examples disclosed herein. In contrast, conventional solutions would significantly hurt efficiency and aggravate linearity. Unary segmented unary array in the examples improves resolution and AM-AM performance without any noticeable efficiency penalty. The phase discontinuity and EVM degradation issues can be solved by the phase correction scheme. The phase correction scheme linearizes phase, allows the array to be segmented any number of times, improves EVM, and saves DPD power consumption by enabling it to run at much lower rate.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The DPA or DAC disclosed herein may be included in a wireless communication device including a user device and a network device, such as a user equipment (UE) or a base station.

Figure 12:
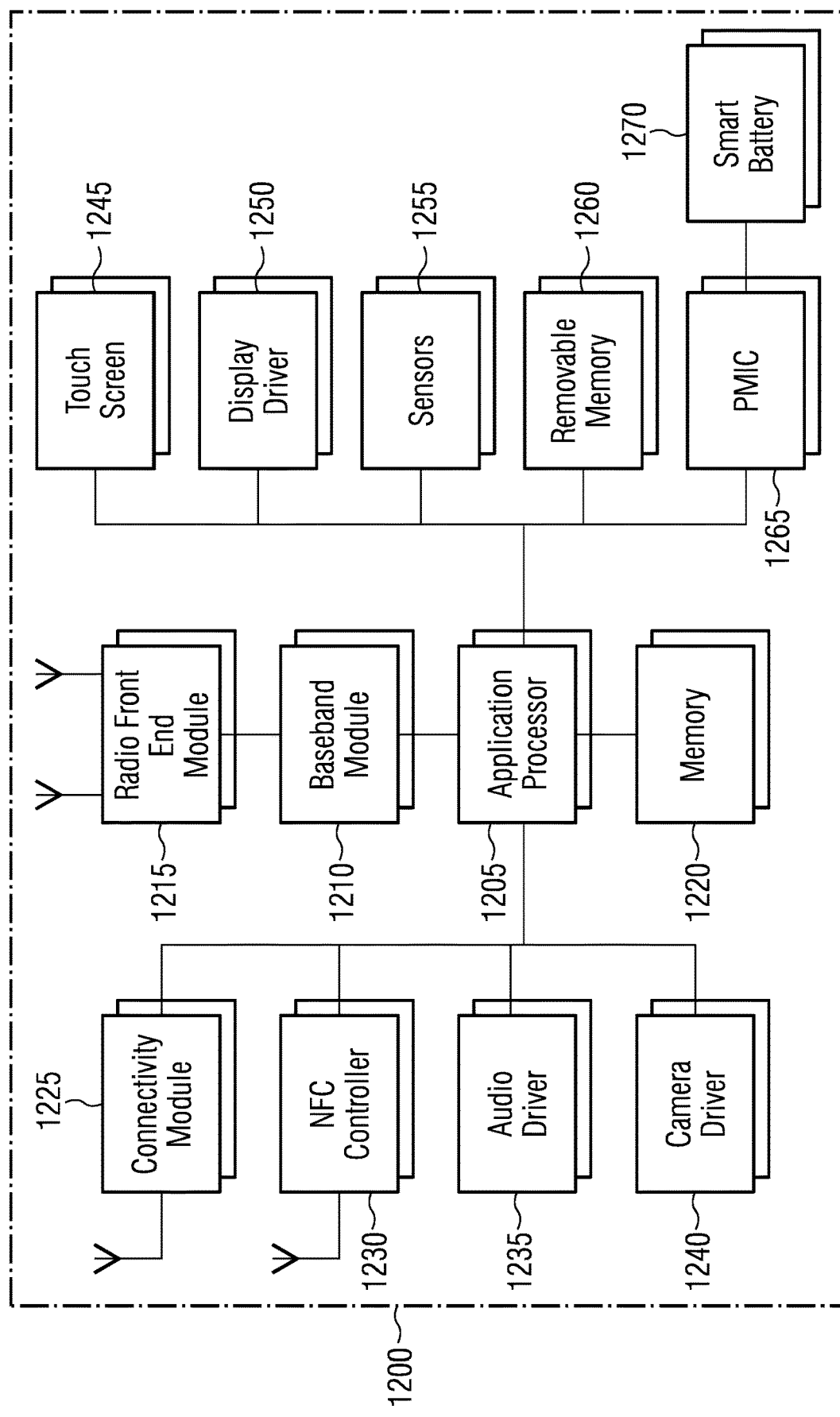
FIG. 12 illustrates a user device in accordance with an aspect.

FIG. 12 illustrates a user device 1200 in accordance with an aspect. The user device 1200 may be a mobile device in some aspects and includes an application processor 1205, baseband processor 1210 (also referred to as a baseband module), radio front end module (RFEM) 1215, memory 1220, connectivity module 1225, near field communication (NFC) controller 1230, audio driver 1235, camera driver 1240, touch screen 1245, display driver 1250, sensors 1255, removable memory 1260, power management integrated circuit (PMIC) 1265 and smart battery 1270.

In some aspects, application processor 1205 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (TO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1210 may be implemented, for example, as a solder-down substrate including one or more integrated circuits, a single packaged integrated circuit soldered to a main circuit board, and/or a multi-chip module containing two or more integrated circuits.

Figure 13:
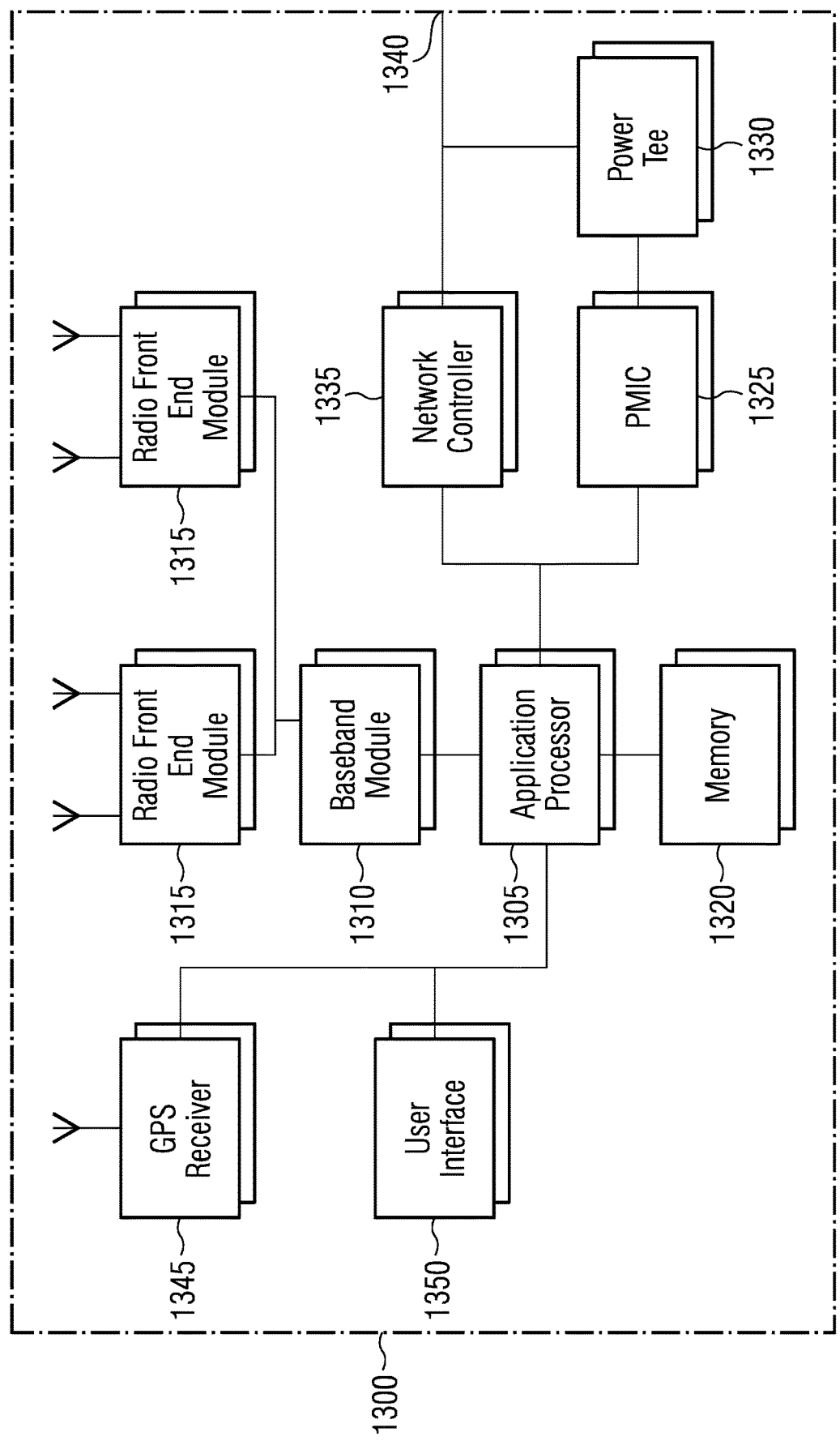
FIG. 13 illustrates a base station or infrastructure equipment radio head in accordance with an aspect.

FIG. 13 illustrates a base station or infrastructure equipment radio head 1300 in accordance with an aspect. The base station radio head 1300 may include one or more of application processor 1305, baseband modules 1310, one or more radio front end modules 1315, memory 1320, power management circuitry 1325, power tee circuitry 1330, network controller 1335, network interface connector 1340, satellite navigation receiver module 1345, and user interface 1350.

In some aspects, application processor 1305 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose TO, memory card controllers such as SD/MMC or similar, USB interfaces, MIPI interfaces and Joint Test Access Group (JTAG) test access ports.

In some aspects, baseband processor 1310 may be implemented, for example, as a solder-down substrate including one or more integrated circuits, a single packaged integrated circuit soldered to a main circuit board or a multi-chip module containing two or more integrated circuits.

In some aspects, memory 1320 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory $A220 may be implemented as one or more of solder down packaged integrated circuits, socketed memory modules and plug-in memory cards.

In some aspects, power management integrated circuitry 1325 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1330 may provide for electrical power drawn from a network cable to provide both power supply and data connectivity to the base station radio head 1300 using a single cable.

In some aspects, network controller 1335 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1345 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1345 may provide data to application processor 1305 which may include one or more of position data or time data. Application processor 1305 may use time data to synchronize operations with other radio base stations.

In some aspects, user interface 1350 may include one or more of physical or virtual buttons, such as a reset button, one or more indicators such as light emitting diodes (LEDs) and a display screen.

The examples as described herein may be summarized as follows:

Example 1 is a device for generating an output signal based on an input digital codeword. The device includes a plurality of switched capacitor cells connected in parallel. Each switched capacitor cell includes a capacitor and a switch. The switch is configured to selectively drive the capacitor in response to a corresponding unary-coded bit of the input digital codeword, and the plurality of switched capacitor cells are divided into a plurality of sub-arrays of switched capacitor cells. The device also includes at least one series capacitor inserted in series between two adjacent sub-arrays of switched capacitor cells. All the sub-arrays of switched capacitor cells may be in a unary-coded structure.

Example 2 is the device of example 1, wherein the switch in the switched capacitor cells is driven by a local oscillator signal.

Example 3 is the device of example 2, further comprising a phase compensation buffer for adjusting a delay of the local oscillator signal supplied to each sub-array of switched capacitor cells.

Example 4 is the device of example 3, wherein the phase compensation buffer comprises a buffer and a plurality of switchable load capacitors connected in parallel to the buffer.

Example 5 is the device as in any one of examples 1-4, further comprising a power combiner for combining outputs from a plurality of arrays of switched capacitor cells.

Example 6 is the device as in any one of examples 1-5, wherein the device is a radio frequency (RF) digital power amplifier or an RF digital-to-analog converter.

Example 7 is a device for generating an output signal based on an input digital codeword. The device comprises a plurality of switched capacitor cells connected in parallel. Each switched capacitor cell includes a capacitor and a switch. The switch is configured to selectively drive the capacitor in response to a corresponding bit of the input digital codeword or a corresponding unary-coded bit of the input digital codeword. The plurality of switched capacitor cells may be divided into a plurality of sub-arrays of switched capacitor cells. The device also includes at least one series capacitor inserted in series between two adjacent sub-arrays of switched capacitor cells. At least one of the sub-arrays of switched capacitor cells may be in a C-2C structure and at least one another of the sub-arrays of switched capacitor cells may be in a unary-coded structure.

Example 8 is the device of example 7, wherein the switch in the switched capacitor cells is driven by a local oscillator signal.

Example 9 is the device of example 8, further comprising at least one phase compensation buffer for adjusting a delay of the local oscillator signal supplied to each switched capacitor cell in a sub-array of switched capacitor cells or to each sub-array of switched capacitor cells.

Example 10 is the device of example 9, wherein the phase compensation buffer comprises a buffer and a plurality of switchable load capacitors connected in parallel to the buffer.

Example 11 is the device as in any one of examples 7-10, further comprising a power combiner for combining outputs from a plurality of arrays of switched capacitor cells.

Example 12 is the device as in any one of examples 7-11, wherein the device is a radio frequency (RF) digital power amplifier or an RF digital-to-analog converter.

Example 13 is a wireless communication device. The wireless communication device comprises a conversion device for generating an output signal based on an input digital codeword. The conversion device comprises a plurality of switched capacitor cells connected in parallel. Each switched capacitor cell includes a capacitor and a switch. The switch is configured to selectively drive the capacitor in response to a corresponding unary-coded bit of the input digital codeword, and the plurality of switched capacitor cells are divided into a plurality of sub-arrays of switched capacitor cells. The conversion device also includes at least one series capacitor inserted in series between two adjacent sub-arrays of switched capacitor cells. All the sub-arrays of switched capacitor cells may be in a unary-coded structure.

Example 14 is the wireless communication device of example 13, wherein the switch in the switched capacitor cells is driven by a local oscillator signal.

Example 15 is the wireless communication device of example 14, wherein the conversion device further comprises a phase compensation buffer for adjusting a delay of the local oscillator signal supplied to each sub-array of switched capacitor cells.

Example 16 is the wireless communication device of example 15, wherein the phase compensation buffer comprises a buffer and a plurality of switchable load capacitors connected in parallel to the buffer.

Example 17 is the wireless communication device as in any one of examples 13-16, further comprising a power combiner for combining outputs from a plurality of arrays of switched capacitor cells.

Example 18 is the wireless communication device as in any one of examples 13-17, wherein the conversion device is a radio frequency (RF) digital power amplifier or an RF digital-to-analog converter.

Example 19 is a wireless communication device. The wireless communication device comprises a conversion device for generating an output signal based on an input digital codeword. The conversion device comprises a plurality of switched capacitor cells connected in parallel. Each switched capacitor cell includes a capacitor and a switch. The switch is configured to selectively drive the capacitor in response to a corresponding bit of the input digital codeword or a corresponding unary-coded bit of the input digital codeword, wherein the plurality of switched capacitor cells are divided into a plurality of sub-arrays of switched capacitor cells. The conversion device also includes at least one series capacitor inserted in series between two adjacent sub-arrays of switched capacitor cells. At least one of the sub-arrays of switched capacitor cells may be in a C-2C structure and at least one another of the sub-arrays of switched capacitor cells may be in a unary-coded structure.

Example 20 is the wireless communication device of example 19, wherein the switch in the switched capacitor cells is driven by a local oscillator signal.

Example 21 is the wireless communication device of example 20, wherein the conversion device further comprises at least one phase compensation buffer for adjusting a delay of the local oscillator signal supplied to each switched capacitor cell in a sub-array of switched capacitor cells or to each sub-array of switched capacitor cells.

Example 22 is the wireless communication device of example 21, wherein the phase compensation buffer comprises a buffer and a plurality of switchable load capacitors connected in parallel to the buffer.

Example 23 is the wireless communication device as in any one of example 19-22, further comprising a power combiner for combining outputs from a plurality of arrays of switched capacitor cells.

Example 24 is the wireless communication device as in any one of examples 19-23, wherein the conversion device is a radio frequency (RF) digital power amplifier or an RF digital-to-analog converter.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A device for generating an output signal based on an input digital codeword, the device comprising:
a plurality of switched capacitor cells connected in parallel, wherein each switched capacitor cell includes a capacitor and a switch and the switch is configured to selectively drive the capacitor in response to a corresponding unary-coded bit of the input digital codeword, and the plurality of switched capacitor cells are divided into a plurality of sub-arrays of switched capacitor cells; and
at least one series capacitor inserted in series between two adjacent sub-arrays of switched capacitor cells,
wherein all the sub-arrays of switched capacitor cells are in a unary-coded structure,
wherein the switch in the switched capacitor cells is driven by a local oscillator signal,
wherein the device further comprises a phase compensation buffer for adjusting a delay of the local oscillator signal supplied to each sub-array of switched capacitor cells.

2. The device of claim 1, wherein the phase compensation buffer comprises a buffer and a plurality of switchable load capacitors connected in parallel to the buffer.

3. The device of claim 1, further comprising:
a power combiner for combining outputs from a plurality of arrays of switched capacitor cells.

4. The device of claim 1, wherein the device is a radio frequency (RF) digital power amplifier or an RF digital-to-analog converter.

5. A device for generating an output signal based on an input digital codeword, the device comprising:
a plurality of switched capacitor cells connected in parallel, wherein each switched capacitor cell includes a capacitor and a switch and the switch is configured to selectively drive the capacitor in response to a corresponding bit of the input digital codeword or a corresponding unary-coded bit of the input digital codeword, wherein the plurality of switched capacitor cells are divided into a plurality of sub-arrays of switched capacitor cells; and
at least one series capacitor inserted in series between two adjacent sub-arrays of switched capacitor cells, wherein at least one of the sub-arrays of switched capacitor cells is in a C-2C structure and at least one another of the sub-arrays of switched capacitor cells is in a unary-coded structure,
wherein the switch in the switched capacitor cells is driven by a local oscillator signal,
wherein the device further comprises at least one phase compensation buffer for adjusting a delay of the local oscillator signal supplied to each switched capacitor cell in a sub-array of switched capacitor cells or to each sub-array of switched capacitor cells.

6. The device of claim 5, wherein the phase correction compensation buffer comprises a buffer and a plurality of switchable load capacitors connected in parallel to the buffer.

7. The device of claim 5, further comprising:
a power combiner for combining outputs from a plurality of arrays of switched capacitor cells.

8. The device of claim 5, wherein the device is a radio frequency (RF) digital power amplifier or an RF digital-to-analog converter.

9. A wireless communication device, comprising:
a conversion device for generating an output signal based on an input digital codeword, comprising:
a plurality of switched capacitor cells connected in parallel, wherein each switched capacitor cell includes a capacitor and a switch and the switch is configured to selectively drive the capacitor in response to a corresponding unary-coded bit of the input digital codeword, and the plurality of switched capacitor cells are divided into a plurality of sub-arrays of switched capacitor cells; and
at least one series capacitor inserted in series between two adjacent sub-arrays of switched capacitor cells,
wherein all the sub-arrays of switched capacitor cells are in a unary-coded structure,
wherein the switch in the switched capacitor cells is driven by a local oscillator signal,
wherein the conversion device further comprises a phase compensation buffer for adjusting a delay of the local oscillator signal supplied to each sub-array of switched capacitor cells.

10. The wireless communication device of claim 9, wherein the phase compensation buffer comprises a buffer and a plurality of switchable load capacitors connected in parallel to the buffer.

11. The wireless communication device of claim 9, further comprising:
a power combiner for combining outputs from a plurality of arrays of switched capacitor cells.

12. The wireless communication device of claim 9, wherein the conversion device is a radio frequency (RF) digital power amplifier or an RF digital-to-analog converter.

13. A wireless communication device, comprising:
a conversion device for generating an output signal based on an input digital codeword, comprising:
a plurality of switched capacitor cells connected in parallel, wherein each switched capacitor cell includes a capacitor and a switch and the switch is configured to selectively drive the capacitor in response to a corresponding bit of the input digital codeword or a corresponding unary-coded bit of the input digital codeword, wherein the plurality of switched capacitor cells are divided into a plurality of sub-arrays of switched capacitor cells; and
at least one series capacitor inserted in series between two adjacent sub-arrays of switched capacitor cells,
wherein at least one of the sub-arrays of switched capacitor cells is in a C-2C structure and at least one another of the sub-arrays of switched capacitor cells is in a unary-coded structure,
wherein the switch in the switched capacitor cells is driven by a local oscillator signal,
wherein the conversion device further comprises at least one phase compensation buffer for adjusting a delay of the local oscillator signal supplied to each switched capacitor cell in a sub-array of switched capacitor cells or to each sub-array of switched capacitor cells.

14. The wireless communication device of claim 13, wherein the phase compensation buffer comprises a buffer and a plurality of switchable load capacitors connected in parallel to the buffer.

15. The wireless communication device of claim 13, further comprising:
a power combiner for combining outputs from a plurality of arrays of switched capacitor cells.

16. The wireless communication device of claim 13, wherein the conversion device is a radio frequency (RF) digital power amplifier or an RF digital-to-analog converter.

* * * * *

UNITED STATES PATENT AND TRADEMARK OFFICE
CERTIFICATE OF CORRECTION

PATENT NO. : 11,290,065 B2
APPLICATION NO. : 16/650882
DATED : March 29, 2022
INVENTOR(S) : Ali Azam et al.

It is certified that error appears in the above-identified patent and that said Letters Patent is hereby corrected as shown below:

In the Claims

In Column 17 Line 13 "corrrection compensation buffer comprises" should read --wherein the phase compensation buffer comprises--.

Signed and Sealed this
Sixteenth Day of August, 2022

Katherine Kelly Vidal
*Director of the United States Patent and Trademark Office*